United States Patent
Chung et al.

(10) Patent No.: US 9,462,697 B2
(45) Date of Patent: Oct. 4, 2016

(54) ELECTRONIC COMPONENT EMBEDDED SUBSTRATE AND MANUFACTURING METHOD THEREOF

(71) Applicant: SAMSUNG ELECTRO-MECHANICS CO., LTD., Suwon (KR)

(72) Inventors: Yul Kyo Chung, Yongin (KR); Doo Hwan Lee, Daejeon (KR); Seung Eun Lee, Sungnam (KR); Yee Na Shin, Suwon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 59 days.

(21) Appl. No.: 14/092,331

(22) Filed: Nov. 27, 2013

(65) Prior Publication Data

US 2014/0144676 A1    May 29, 2014

(30) Foreign Application Priority Data

Nov. 29, 2012 (KR) .................. 10-2012-0137048

(51) Int. Cl.
*H05K 1/16* (2006.01)
*H05K 1/18* (2006.01)
*H05K 3/46* (2006.01)

(52) U.S. Cl.
CPC ..... *H05K 1/186* (2013.01); *H01L 2924/15311* (2013.01); *H05K 3/4644* (2013.01);
(Continued)

(58) Field of Classification Search
CPC ............ H05K 1/00; H05K 1/02; H05K 1/11; H05K 1/14; H05K 1/16; H05K 1/18; H05K 3/00; H05K 3/10; H05K 3/30; H05K 3/32; H05K 3/36; H05K 3/46; H05K 3/48; H05K 3/50; H05K 7/20; H01L 21/00; H01L 21/50; H01L 23/02; H01L 23/12; H01G 4/12; H01G 4/30; H01G 4/228
USPC ....... 174/260, 250, 252, 256, 258, 261, 262, 174/264; 361/301.4, 321.3, 719, 760, 761, 361/763, 784; 257/532, 678, 700; 438/125
See application file for complete search history.

(56) References Cited

U.S. PATENT DOCUMENTS 6,324,067 B1 * 11/2001 Nishiyama .................... 361/761
6,876,554 B1 *  4/2005 Inagaki et al. ................ 361/763
(Continued)

FOREIGN PATENT DOCUMENTS

CN        1722935       1/2006
KR   10-2007-0101183    10/2007
(Continued)

OTHER PUBLICATIONS

Taiwanese Office Action dated Jan. 6, 2015 in corresponding Taiwanese Patent Application No. 102140410.
(Continued)

*Primary Examiner* — Xiaoliang Chen
(74) *Attorney, Agent, or Firm* — NSIP Law

(57) ABSTRACT

The present invention relates to an electronic component embedded substrate including: a first insulating layer including a cavity; an electronic component inserted in the cavity; a first metal pattern formed on a lower surface of the first insulating layer to mount the electronic component thereon and including at least one guide hole for exposing a portion of the external electrode; a second insulating layer formed on the lower surface of the first insulating layer to cover the first metal pattern; a first circuit pattern formed on a lower surface of the second insulating layer; and a first via for electrically connecting the first external electrode exposed through the guide hole and the first circuit pattern, and can improve electrical connectivity between the external electrode and the via even when the size of the external electrode of the electronic component is reduced than before.

18 Claims, 14 Drawing Sheets

(52) U.S. Cl.
CPC ... *H05K3/4697* (2013.01); *H05K 2201/10015* (2013.01); *H05K 2201/10636* (2013.01); *Y02P 70/611* (2015.11); *Y10T 29/4913* (2015.01)

(56) References Cited

U.S. PATENT DOCUMENTS

| | | | |
|---|---|---|---|
| 7,102,085 B2* | 9/2006 | Ohta et al. | 174/260 |
| 2002/0033378 A1* | 3/2002 | Hayashi et al. | 216/11 |
| 2002/0185303 A1* | 12/2002 | Takeuchi et al. | 174/256 |
| 2003/0015342 A1* | 1/2003 | Sakamoto et al. | 174/250 |
| 2003/0116843 A1* | 6/2003 | Iijima et al. | 257/700 |
| 2004/0014317 A1* | 1/2004 | Sakamoto et al. | 438/689 |
| 2004/0104451 A1* | 6/2004 | Ooi et al. | 257/532 |
| 2005/0217893 A1* | 10/2005 | Noguchi et al. | 174/250 |
| 2006/0014327 A1* | 1/2006 | Cho et al. | 438/125 |
| 2006/0054352 A1* | 3/2006 | Ryu et al. | 174/260 |
| 2006/0097370 A1* | 5/2006 | Bartley et al. | 257/678 |
| 2006/0255440 A1* | 11/2006 | Miyazaki et al. | 257/679 |
| 2007/0114647 A1* | 5/2007 | Hsu | 257/679 |
| 2007/0117338 A1* | 5/2007 | Yamamoto et al. | 438/396 |
| 2007/0121273 A1* | 5/2007 | Yamamoto et al. | 361/306.2 |
| 2008/0023821 A1* | 1/2008 | Hsu | 257/700 |
| 2008/0024998 A1* | 1/2008 | Hsu | 361/719 |
| 2008/0037199 A1* | 2/2008 | Fukudome et al. | 361/321.3 |
| 2008/0043400 A1* | 2/2008 | Fukudome et al. | 361/301.4 |
| 2008/0149381 A1* | 6/2008 | Kawagishi et al. | 174/261 |
| 2009/0205859 A1* | 8/2009 | Tanaka et al. | 174/260 |
| 2009/0242252 A1* | 10/2009 | Tanaka | 174/260 |
| 2009/0244865 A1* | 10/2009 | Tanaka | 361/764 |
| 2009/0266594 A1* | 10/2009 | Yoshikawa | 174/260 |
| 2009/0310323 A1* | 12/2009 | Baek et al. | 361/784 |
| 2010/0149768 A1* | 6/2010 | Takaike | 361/761 |
| 2010/0163290 A1* | 7/2010 | Nagata | 174/260 |
| 2010/0181285 A1* | 7/2010 | Tanaka | 216/17 |
| 2010/0213616 A1* | 8/2010 | Uchiyama | 257/773 |
| 2010/0224397 A1* | 9/2010 | Shimizu et al. | 174/260 |
| 2010/0288535 A1* | 11/2010 | Hong et al. | 174/252 |
| 2010/0300737 A1* | 12/2010 | Sato et al. | 174/260 |
| 2011/0141711 A1* | 6/2011 | Sohn et al. | 361/760 |
| 2011/0240354 A1* | 10/2011 | Furuhata et al. | 174/258 |
| 2012/0087097 A1* | 4/2012 | Hong et al. | 361/763 |
| 2012/0176751 A1* | 7/2012 | Sakai et al. | 361/746 |
| 2012/0181074 A1* | 7/2012 | Ishihara et al. | 174/261 |
| 2012/0186866 A1* | 7/2012 | Mikado et al. | 174/260 |
| 2012/0188734 A1* | 7/2012 | Mikado et al. | 361/761 |
| 2012/0212919 A1* | 8/2012 | Mano et al. | 361/782 |
| 2012/0227261 A1* | 9/2012 | Inui | 29/849 |
| 2012/0241205 A1* | 9/2012 | Shimizu | 174/260 |
| 2012/0287586 A1* | 11/2012 | Mikado et al. | 361/748 |
| 2012/0307466 A1* | 12/2012 | Fujidai et al. | 361/763 |
| 2013/0020120 A1* | 1/2013 | Ishihara et al. | 174/262 |
| 2013/0182401 A1* | 7/2013 | Furutani et al. | 361/782 |
| 2013/0194764 A1* | 8/2013 | Mikado et al. | 361/761 |

FOREIGN PATENT DOCUMENTS

| | | |
|---|---|---|
| KR | 10-2009-0130727 | 12/2009 |
| KR | 10-2011-0093421 | 8/2011 |
| KR | 10-1084776 | 11/2011 |
| KR | 10-2012-0124347 | 11/2012 |
| TW | 200625572 | 1/1994 |

OTHER PUBLICATIONS

Korean Notice of Allowance issued Apr. 23, 2014 in corresponding Korean Patent Application No. 10-2012-0137048

* cited by examiner

ELECTRONIC COMPONENT EMBEDDED SUBSTRATE AND MANUFACTURING METHOD THEREOF

CROSS-REFERENCE TO RELATED APPLICATIONS

This application claims the foreign priority benefit under 35 U.S.C. Section 119 of Korean Patent Application Serial No. 10-2012-0137048, filed Nov. 29, 2012, which is hereby incorporated by reference in its entirety into this application.

BACKGROUND OF THE INVENTION

1. Field of the Invention

The present invention relates to an electronic component embedded substrate.

2. Description of the Related Art

As the recently released mobile devices such as smartphones and tablet PCs have been dramatically improved in performance and demanded to have high portability, studies on miniaturization, slimming, and high performance of electronic components used in these mobile devices have been continuously made.

Here, since an electronic component embedded substrate disclosed in Patent Document 1 etc. can secure a space for mounting extra components on its surface by embedding electronic components in a substrate, it has been highlighted as a way of implementing the miniaturization, slimming, and high performance of the electronic components mounted in the mobile devices.

In particular, as the performance of semiconductor chips is improved, stability of power supplied to the semiconductor chips is considered as important. For this, a decoupling capacitor or a bypass capacitor is provided between the semiconductor chip and a power supply line to remove noise of power and supply a stable current to the semiconductor chip in a situation in which a power supply current is being changed suddenly.

At this time, when mounting the semiconductor chip on the capacitor embedded substrate, since a distance between the decoupling capacitor and the semiconductor chip is minimized, it is possible to implement miniaturization and slimming while stably supplying power to the high performance semiconductor chip.

Meanwhile, according to Patent Document 1, a method of fixing a capacitor after processing a cavity in a position where an electronic component is to be inserted, embedding the electronic component by thermocompression using an insulator, processing a micro via hole with laser, and achieving electrical connection through plating is disclosed.

That is, in order to electrically connect between the electronic component embedded in a substrate and a circuit pattern provided on a surface of the substrate, a method of processing a via hole using laser and filling a conductive material in the via hole by a method such as plating has been commonly applied.

According to this common method, minimum conditions on the area of a via contact which is to be formed in the embedded electronic component can be determined according to factors such as placing tolerance generated when the electronic component is embedded in the substrate, via hole processing tolerance, and via hole size.

However, since the size of the via contact should be reduced according to a reduction in the size of the electronic component, as the electronic component becomes smaller, a matching error of the via and the electronic component is emerged as a serious problem.

RELATED ART DOCUMENT

Patent Document

Patent Document 1: Korean Patent Laid-open Publication No. 2007-0101183

SUMMARY OF THE INVENTION

The present invention has been invented in order to overcome the above-described problems and it is, therefore, an object of the present invention to provide an electronic component embedded substrate that can improve electrical connectivity of an electronic component embedded in a substrate.

Further, it is another object of the present invention to provide an electronic component embedded substrate that can improve electronic connectivity of an electronic component embedded in a substrate.

In accordance with one aspect of the present invention to achieve the object, there is provided an electronic component embedded substrate including: a first insulating layer including a cavity; an electronic component inserted in the cavity and having at least one external electrode; a first metal pattern formed on a lower surface of the first insulating layer to mount the electronic component thereon and including at least one guide hole for exposing a portion of the external electrode; a second insulating layer formed on the lower surface of the first insulating layer to cover the first metal pattern; a first circuit pattern formed on a lower surface of the second insulating layer; and a first via for electrically connecting the first external electrode exposed through the guide hole and the first circuit pattern.

At this time, the first metal pattern may be formed in plural number to correspond to the respective external electrodes, and the first metal patterns may be separated from each other by a gap.

Further, the electronic component embedded substrate may further include a second via for electrically connecting the first metal pattern and the first circuit pattern.

Further, the electronic component embedded substrate may further include a second metal pattern formed on an upper surface of the first insulating layer to define a formation region of the cavity.

At this time, a sidewall of the second metal pattern and a sidewall of the cavity may be positioned on the same plane.

Further, the second metal pattern may be disposed to be separated from the sidewall of the cavity.

Further, the electronic component embedded substrate may further include a through-via passing through the first insulating layer to electrically connect the first metal pattern and the second metal pattern.

Further, the electronic component embedded substrate may further include a third insulating layer formed on the upper surface of the first insulating layer to cover the second metal pattern and the electronic component; and a second circuit pattern formed on an upper surface of the third insulating layer.

Further, the electronic component embedded substrate may further include a third via passing through the third insulating layer to electrically connect the external electrode and the second circuit pattern.

Further, the electronic component embedded substrate may further include a fourth via passing through the third insulating layer to electrically connect the second circuit pattern and the second metal pattern.

Further, the electronic component embedded substrate may further include a filler for filling a space between the cavity and the electronic component.

Further, the third insulating layer and the filler may be formed integrally.

Further, an insulating adhesive layer may be further provided between a lower surface of the electronic component and the first metal pattern, and the first via may be in contact with the external electrode through the insulating adhesive layer.

Further, the first via may be self-aligned with the external electrode by the guide hole.

Further, the first metal pattern may be in contact with the external electrode.

At this time, the first via may be in contact with the external electrode exposed through the guide hole and the first metal pattern.

In accordance with another aspect of the present invention to achieve the object, there is provided a method of manufacturing an electronic component embedded substrate including: forming a cavity in a first insulating layer; forming a first metal pattern which is formed on a lower surface of the first insulating layer to extend to a region of the cavity and includes at least one guide hole; mounting an electronic component on the first metal pattern by inserting the electronic component in the cavity; forming a second insulating layer on the lower surface of the first insulating layer to cover the first metal pattern; exposing a lower surface of the electronic component through the guide hole by forming a via hole passing through the second insulating layer; and forming a first via inside the via hole to be in contact with the lower surface of the electronic component.

At this time, the via hole may be formed by irradiating $CO_2$ laser to the second insulating layer.

Further, the electronic component may be inserted in the cavity in a state in which an insulating adhesive layer is formed on an upper surface of the first metal pattern.

Further, the electronic component may be inserted in the cavity in a state in which an insulating adhesive layer is formed on the lower surface of the electronic component.

Further, the step of forming the first metal pattern may include the steps of: adhering an insulating adhesive layer to the lower surface of the first insulating layer; forming a metal layer on a lower surface of the insulating adhesive layer; and removing a metal material in a region of the metal layer in which the guide hole is to be provided.

Further, the cavity may be formed by irradiating laser in a state in which a second metal pattern having a mask hole is coupled to an upper surface of the first insulating layer.

Further, the method of manufacturing an electronic component embedded substrate may further include the step of forming a third insulating layer on the upper surface of the first insulating layer to cover an upper surface of the second metal pattern and an upper surface of the electronic component.

Further, the electronic component may have at least two external electrodes, the first metal pattern may be formed in plural number to correspond to the respective external electrodes, and the first metal patterns may be separated from each other by a gap.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 6a to 6e are process diagrams schematically showing a method of manufacturing an electronic component embedded substrate in accordance with an embodiment of the present invention, wherein FIG. 6a is a cross-sectional view schematically showing the state before an electronic component is inserted in a cavity, FIG. 6b is a cross-sectional view schematically showing the state in which the electronic component is inserted in the cavity, FIG. 6c is a cross-sectional view schematically showing the state in which a second insulating layer and a third insulating layer are formed, FIG. 6d is a cross-sectional view schematically showing the state in which a via and a circuit pattern are formed on the second insulating layer and the third insulating layer, and FIG. 6e is a cross-sectional view schematically showing the state in which a solder resist and a solder bump are formed and a surface mount component is coupled; and FIGS. 7a to 7e are process diagrams schematically showing a method of manufacturing an electronic component embedded substrate in accordance with another embodiment of the present invention, wherein FIG. 7a is a cross-sectional view schematically showing the state before an electronic component is inserted in a cavity, FIG. 7b is a cross-sectional view schematically showing the state in which the electronic component is inserted in the cavity and the electronic component is fixed by an insulating adhesive layer, FIG. 7c is a cross-sectional view schematically showing the state in which a second insulating layer and a third insulating layer are formed, FIG. 7d is a cross-sectional view schematically showing the state in which a via and a circuit pattern are formed on the second insulating layer and the third insulating layer, and FIG. 7e is a cross-sectional view schematically showing the state in which a solder resist and a solder bump are formed and a surface mount component is coupled.

DETAILED DESCRIPTION OF THE PREFERABLE EMBODIMENTS

Figure 1A:
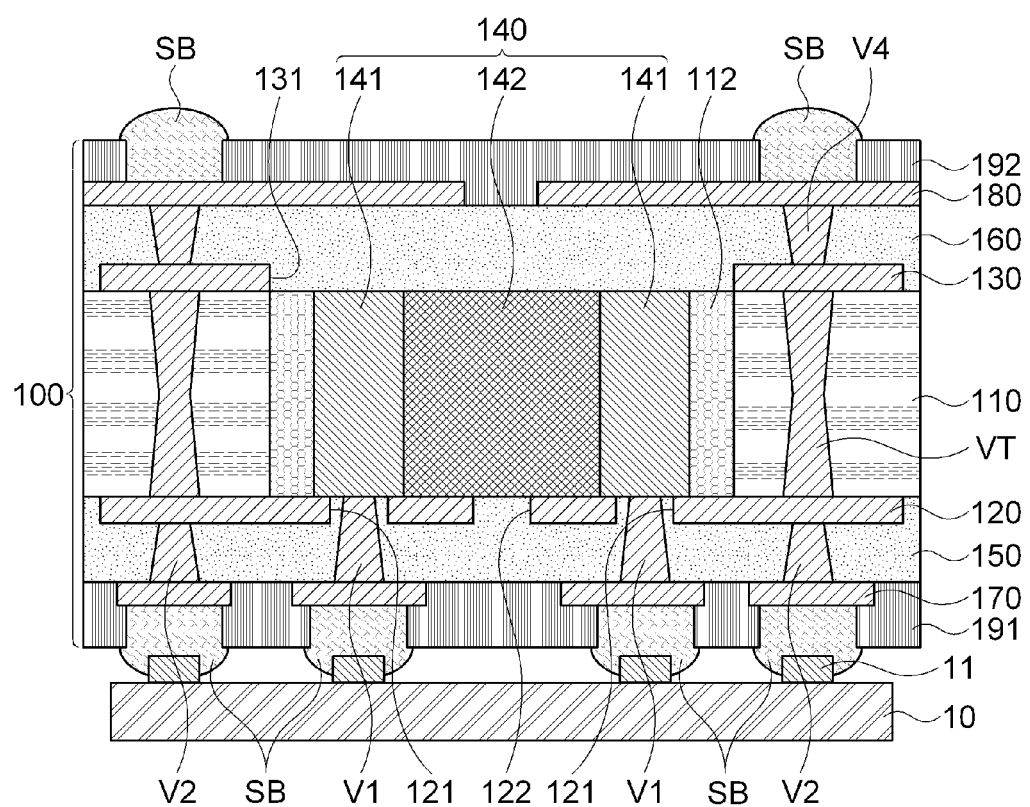
FIG. 1a is a view schematically showing an electronic component embedded substrate in accordance with an embodiment of the present invention.

Advantages and features of the present invention and methods of accomplishing the same will be apparent by referring to embodiments described below in detail in connection with the accompanying drawings. However, the present invention is not limited to the embodiments disclosed below and may be implemented in various different forms. The embodiments are provided only for completing the disclosure of the present invention and for fully representing the scope of the present invention to those skilled in the art. Like reference numerals refer to like elements throughout the specification.

Terms used herein are provided to explain embodiments, not limiting the present invention. Throughout this specification, the singular form includes the plural form unless the context clearly indicates otherwise. When terms "comprises" and/or "comprising" used herein do not preclude existence and addition of another component, step, operation and/or device, in addition to the above-mentioned component, step, operation and/or device.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

Hereinafter, configurations and operational effects of the present invention will be described in detail with reference to the accompanying drawings.

Figure 2A:
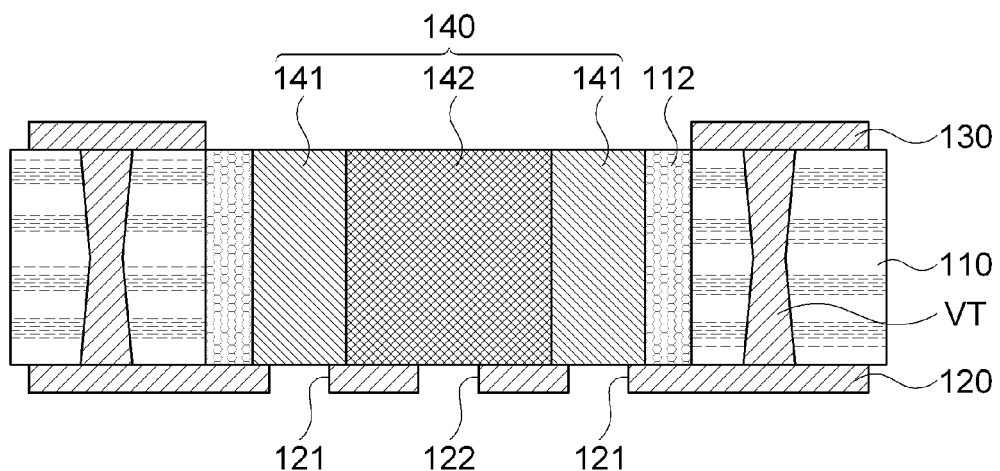
FIG. 2a is a cross-sectional view schematically showing a main part of the electronic component embedded substrate in accordance with an embodiment of the present invention.
Figure 2B:
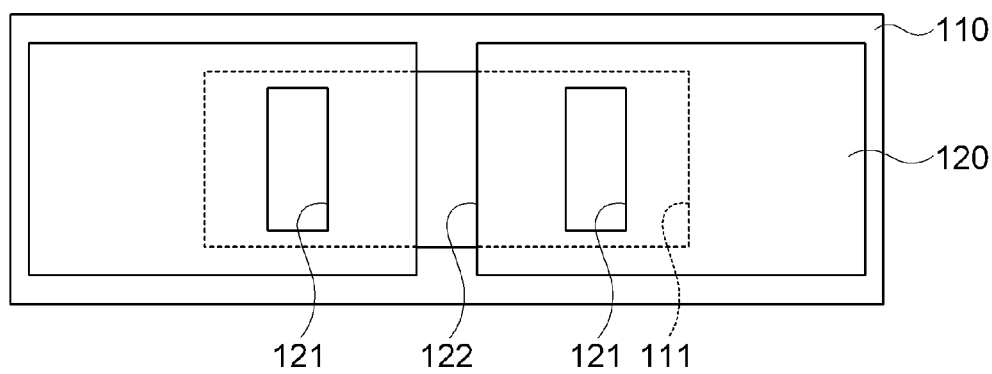
FIG. 2b is a bottom view schematically showing the state in which an electronic component is excluded from the main part of the electronic component embedded substrate in accordance with an embodiment of the present invention.
Figure 2C:
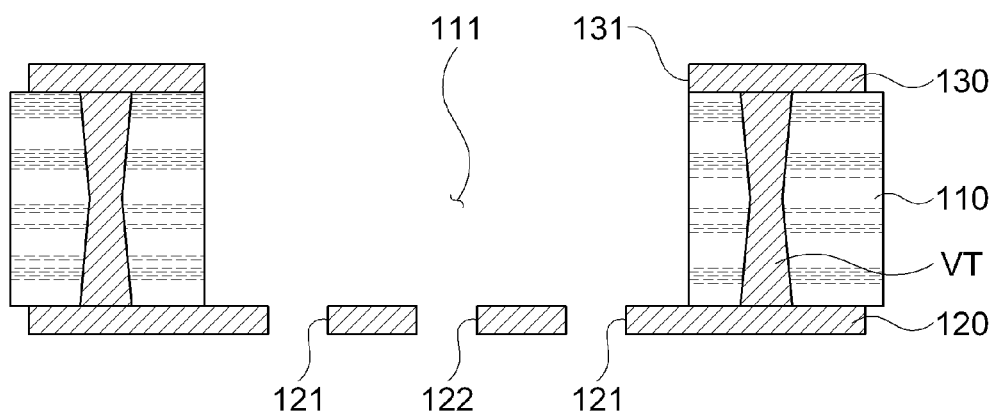
FIG. 2c is a cross-sectional view schematically showing the state in which the electronic component is excluded from the main part of the electronic component embedded substrate in accordance with an embodiment of the present invention.

FIG. 1a is a view schematically showing an electronic component embedded substrate 100 in accordance with an embodiment of the present invention, FIG. 2a is a cross-sectional view schematically showing a main part of the electronic component embedded substrate 100 in accordance with an embodiment of the present invention, FIG. 2b is a bottom view schematically showing the state in which an electronic component 140 is excluded from the main part of the electronic component embedded substrate 100 in accordance with an embodiment of the present invention, and FIG. 2c is a cross-sectional view schematically showing the state in which the electronic component 140 is excluded from the main part of the electronic component embedded substrate 100 in accordance with an embodiment of the present invention.

Referring to FIGS. 1a and 2a to 2c, the electronic component embedded substrate 100 in accordance with an embodiment of the present invention may include a first insulating layer 110, the electronic component 140, a first metal pattern 120, a second insulating layer 150, a first circuit pattern, and a first via V1.

The first insulating layer 110 may be implemented as an insulator having a cavity 111 in which the electronic component 140 is inserted or a typical core layer.

The electronic component 140 may be an active element or a passive element such as a capacitor, and the entire or a portion of the electronic component 140 may be inserted in the cavity 111 provided in the first insulating layer 110.

At this time, although the drawing shows that the electronic component 140 is a capacitor having two external electrodes 141, the electronic component 140 is not limited thereto.

The first metal pattern 120 may be coupled to lower surfaces of the electronic component 140 and the first insulating layer 110 and have a guide hole 121 and a gap 122.

The guide hole 121 may be formed in various shapes such as circle, oval, triangle, and polygon and pass through a front surface and a rear surface of the first metal pattern 120 so that a portion of the external electrode 141 of the electronic component 140 can be exposed.

The gap 122 performs a function of electrically disconnecting a left region and a right region of the first metal pattern 120 and prevents the external electrodes 141 from being electrically connected to each other when the external electrodes 141 of the electronic component 140 are two.

At this time, more than three external electrodes 141 may be provided. In this case, the first metal pattern 120 may be formed in plural number to correspond to the respective external electrodes 141, and the first metal patterns 120 may be electrically separated by the gap.

The second insulating layer 150 may be in contact with a portion of the lower surface of the first insulating layer 110, a lower surface of the first metal pattern 120, a lower surface of the external electrode 141 exposed by the guide hole 121, and the lower surface of the electronic component 140 exposed by the gap 122.

The first circuit pattern 170 may be formed on a lower surface of the second insulating layer 150 and electrically connected to the lower surface of the external electrode 141 by the first via V1.

The electronic component 140 embedded in the first insulating layer 110 and the second insulating layer 150 may be electrically connected to the first circuit pattern 170, which is an external wiring, by the first via V1 etc.

Generally, via holes for forming the first via V1 are processed after the second insulating layer 150 is formed. At this time, the via hole for forming the first via V1 is processed by irradiating $CO_2$ laser to the second insulating layer 150 under the electronic component 140, particularly under the external electrode 141.

For example, when processing a via hole using $CO_2$ laser, since a via contact area of about 150 μm is required and a placing tolerance of about 50 μm generated when mounting an electronic component may occur, it is required to secure a via contact size of at least 200 μm.

In a capacitor having a size of 1.0×0.5 mm which is widely used in recent times, since one side size of an external electrode may be implemented as greater than 200 μm, there is no big problem with application of a conventional general method.

However, when the size of the capacitor is reduced to 0.6×0.3 mm or 0.4×0.2 mm, since the size of the external electrode of the capacitor is also reduced to less than 120 μm, it is difficult to form a via by the above-described general method or to implement electrical connection using a via.

In order to overcome these problems of the prior art, in the electronic component embedded substrate 100 in accordance with an embodiment of the present invention, since the first metal pattern 120 having the guide hole 121 is provided on the lower surface of the electronic component 140, even when the size of the external electrode 141 of the electronic component 140 is reduced than before, $CO_2$ laser irradiated to the second insulating layer 150 can't penetrate the first metal pattern 120 and removes only the second insulating layer 150 in the guide hole 121 portion, thus processing a precise via hole.

Further, the first via V1 may be self-aligned with the external electrode 141 by the guide hole 121.

Accordingly, it is possible to overcome the conventional problem that the smaller the size of the external electrode 141, the lower the connectivity between the external electrode 141 and the via due to factors such as placing tolerance, via hole processing tolerance, and via hole size.

Continuously, referring to FIG. 1a, a second metal pattern 130 may be further provided on a portion of an upper surface of the first insulating layer 110.

A mask hole 131, which is formed by opening a portion corresponding to a region above the cavity 111 of the first insulating layer 110, may be provided in the second metal pattern 130.

That is, after a metal layer for forming the second metal pattern 130 is formed in a state in which the cavity 111 is not provided in the first insulating layer 110, the second metal pattern 130 is implemented by removing the metal layer in the portion corresponding to the region, where the cavity 111 is to be formed, to form the mask hole 131.

The second metal pattern 130 implemented in this way may perform a role of a mask in the process of forming the cavity 111 by laser drilling.

Further, when forming the cavity 111 using the second metal pattern 130 as a mask like this, a sidewall of the mask hole 131 and a sidewall of the cavity 111 may be positioned on almost the same vertical line.

Of course, when considering universal characteristics of laser drilling, a width of the cavity 111 may be reduced downward from the portion where the first insulating layer 110 is in contact with the second metal pattern 130.

Figure 1B:
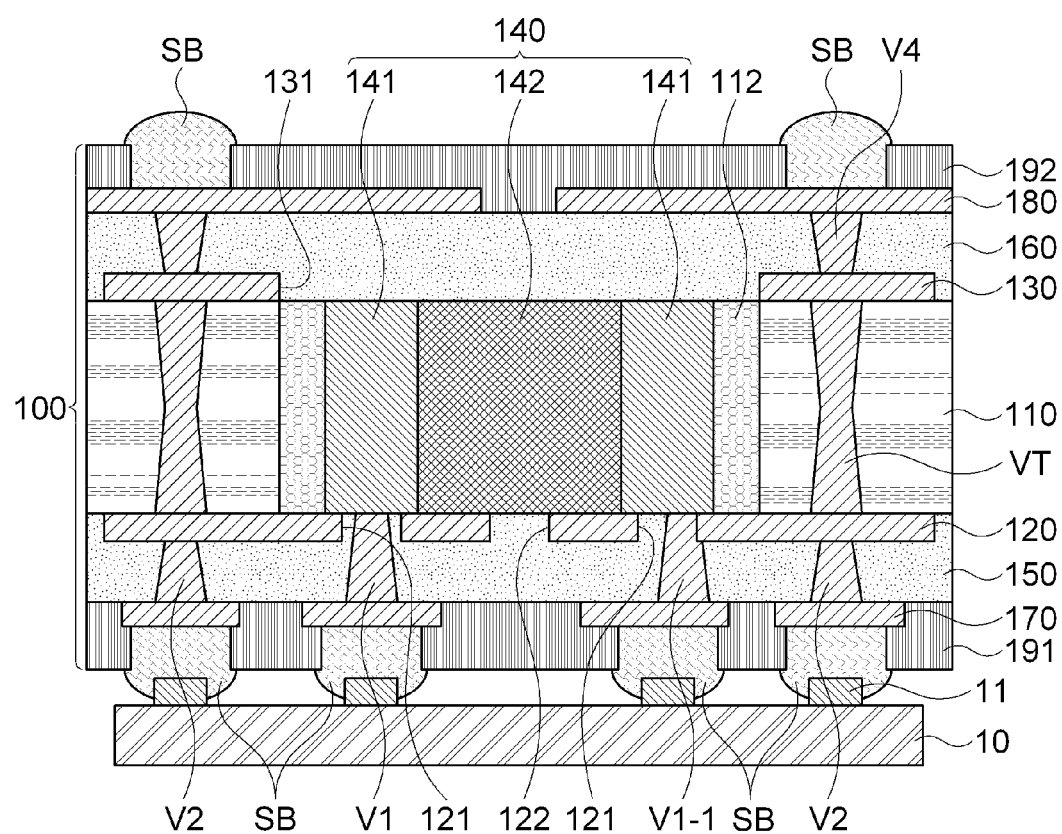
FIG. 1b is a view schematically showing a modified example of the electronic component embedded substrate in accordance with an embodiment of the present invention.
Figure 1C:
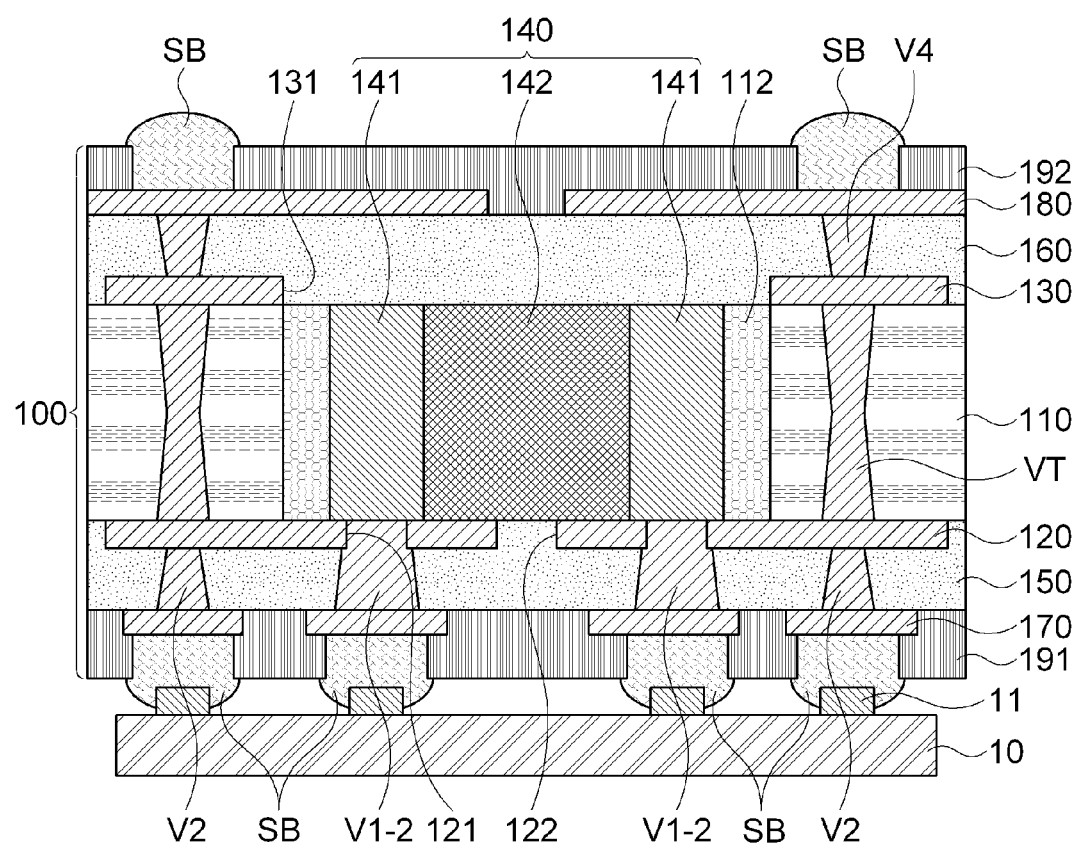
FIG. 1c is a view schematically showing another modified example of the electronic component embedded substrate in accordance with an embodiment of the present invention.
Figure 1D:
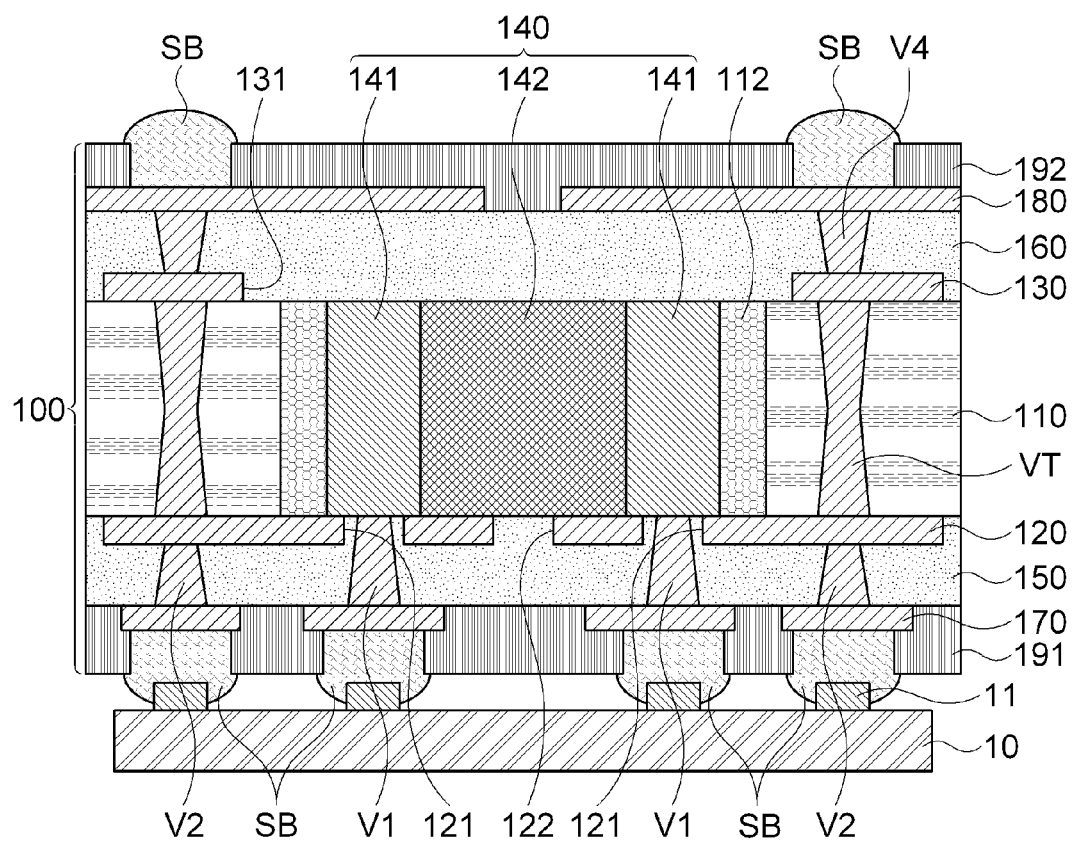
FIG. 1d is a view schematically showing still another modified example of the electronic component embedded substrate in accordance with an embodiment of the present invention.

Further, as shown in FIG. 1d, the sidewall of the mask hole 131 and the sidewall of the cavity 111 shouldn't be positioned on the vertical line.

Meanwhile, when the second metal pattern 130 and the first metal pattern 120 are respectively provided on the upper surface and the lower surface of the first insulating layer 110, a through via VT etc. may further provided to electrically connect the second metal pattern 130 and the first metal pattern 120 when necessary.

Further, a non-conductive filler may be filled in a space between the electronic component 140 and the cavity 111. At this time, when a third insulating layer 160 is further provided to cover the upper surface of the first insulating layer 110, an upper surface of the second metal pattern 130, and an upper surface of the electronic component 140, a material of the third insulating layer 160 may be filled in the space between the electronic component 140 and the cavity 111. That is, the non-conductive filler and the material of the third insulating layer 160 may be the same material.

Further, a plurality of vias such as a second via V2 etc. may be further provided between the first metal pattern 120 and the first circuit pattern 170 in addition to the first via V1 when necessary, and the second via V2 etc. may penetrate the second insulating layer 150.

Further, when a second circuit pattern 180 is provided on an upper surface of the third insulating layer 160, one or more fourth vias V4 may be provided to electrically connect between the second metal pattern 130 and the second circuit pattern 180.

Meanwhile, a first solder resist 191 may be provided on a lower surface of the first circuit pattern 170, and a solder bump SB in contact with the first circuit pattern 170 may be provided to be connected to a surface mount component 10 such as a semiconductor chip.

Further, a second solder resist 192 and a solder bump SB may be provided on an upper surface of the second circuit pattern 180.

FIG. 1b is a view schematically showing a modified example of the electronic component embedded substrate 100 in accordance with an embodiment of the present invention, and FIG. 1c is a view schematically showing another modified example of the electronic component embedded substrate 100 in accordance with an embodiment of the present invention.

Referring to FIG. 1b, it will be understood that stable electrical connectivity can be secured between the external electrode 141 of the electronic component 140 and the first circuit pattern 170 even though the first via V1 is formed in the region deviated from the center of the guide hole 121 due to factors such as via hole processing tolerance and placing tolerance of the electronic component 140.

Further, referring to FIG. 1c, since the first metal pattern 120 performs a role of a mask in the via hole processing process so that the via hole can be accurately processed in the region inside the guide hole 121 even though a diameter of the via hole is increased, it will be understood that the first via V1-2 formed by filling the via hole processed like this can be also coupled while maximizing a contact area with the external electrode 141 of the electronic component 140.

Further, since the first via V1-2 shown in FIG. 1c is in contact with the first metal pattern 120 and the first metal pattern 120 is also in contact with the external electrode 141, a width of a charge transfer path between the external electrode 141 and the first circuit pattern 170 can be remarkably increased than before.

In addition, the first metal pattern 120 in accordance with an embodiment of the present invention may perform a role of supporting the electronic component 140 in the process of mounting the electronic component 140 in the cavity 111.

Figure 3:
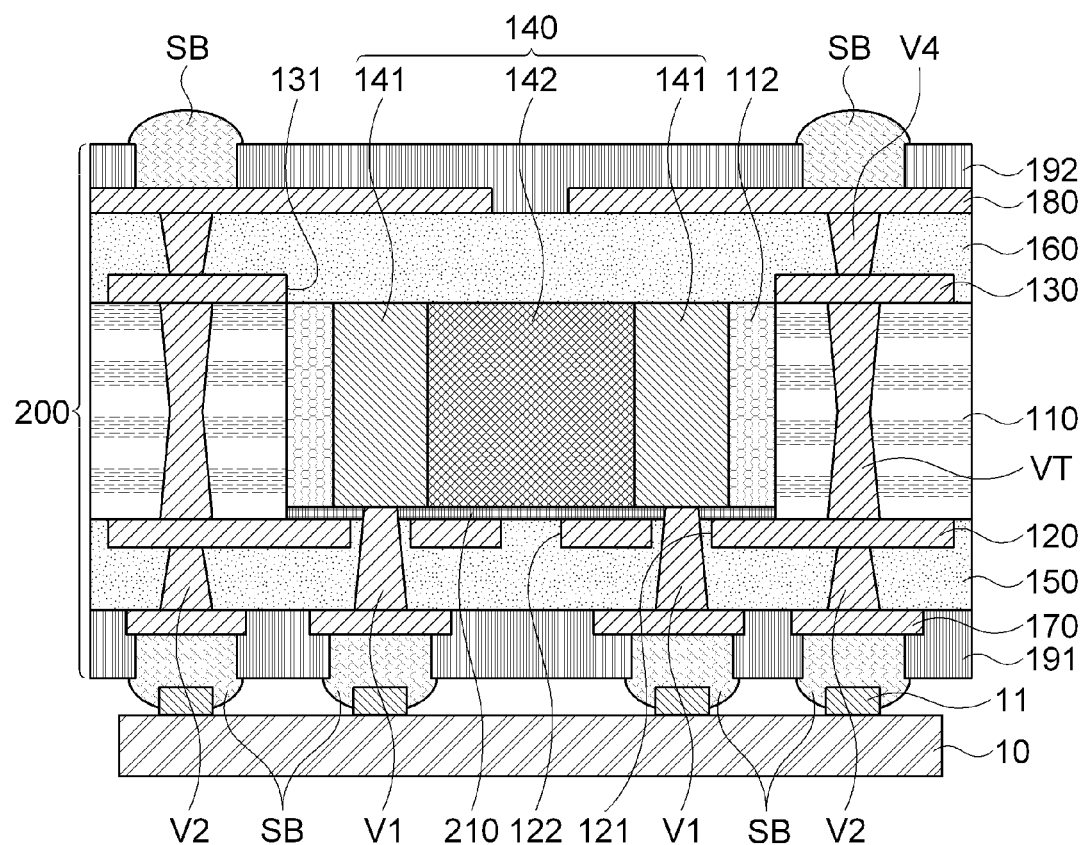
FIG. 3 is a view schematically showing an electronic component embedded substrate in accordance with another embodiment of the present invention.

FIG. 3 is a view schematically showing an electronic component embedded substrate 200 in accordance with another embodiment of the present invention.

Referring to FIG. 3, it will be understood that the electronic component embedded substrate 200 in accordance with the present embodiment may further include an insulating adhesive layer 210 between the electronic component 140 and the first metal pattern 120, unlike the above-described embodiment.

At this time, the insulating adhesive layer 210 may be formed in a way to insert the electronic component 140 in the cavity 111 in a state of being applied on the lower surface of the electronic component 140 or in a way to insert the electronic component 140 in a state of being provided on the upper surface of the first metal pattern 120.

Figure 4:
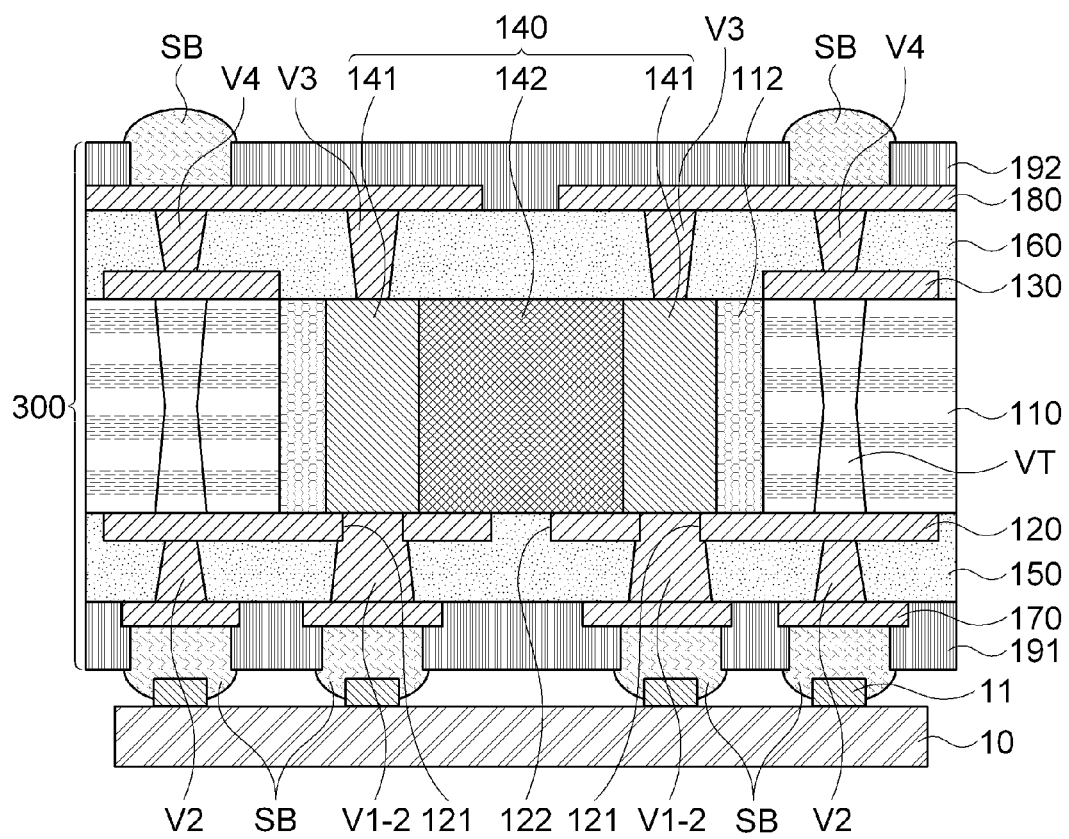
FIG. 4 is a view schematically showing an electronic component embedded substrate in accordance with still another embodiment of the present invention.

FIG. 4 is a view schematically showing an electronic component embedded substrate 300 in accordance with still another embodiment of the present invention.

Referring to FIG. 4, it will be understood that a third via V3, which is electrically connected to the outside through the third insulating layer 160, may be further formed on the upper surface of the electronic component 140, unlike the above-described embodiment.

Figure 5:
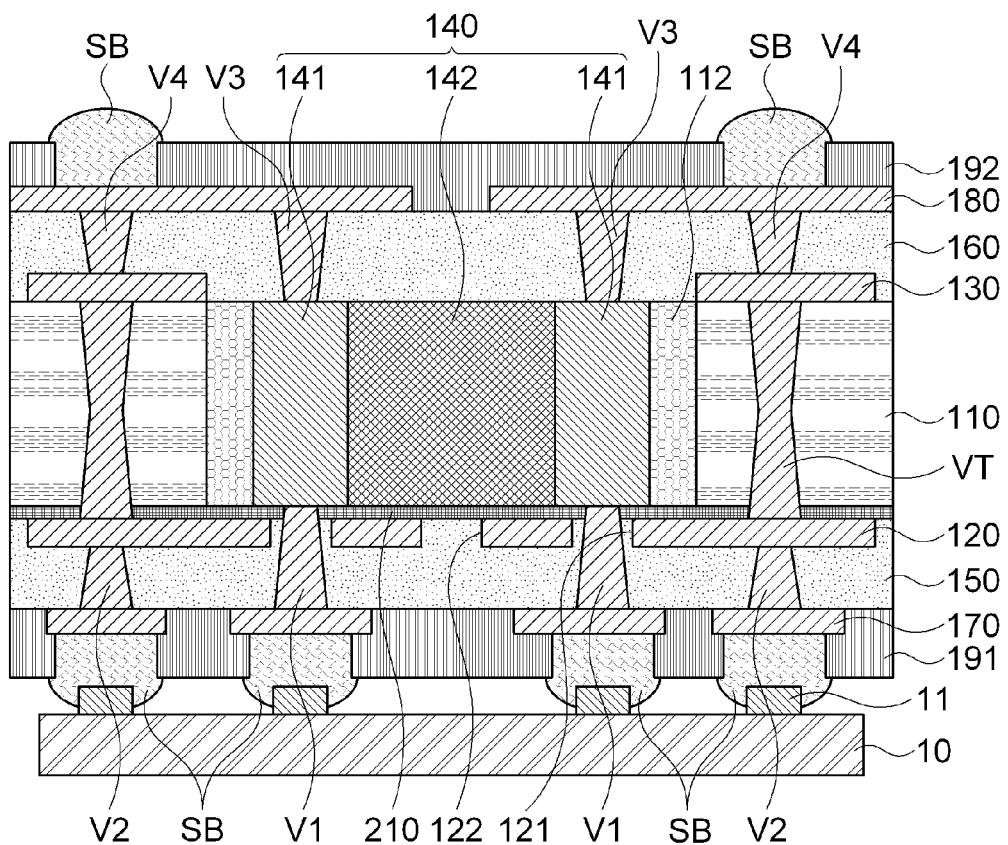
FIG. 5 is a view schematically showing an electronic component embedded substrate in accordance with yet another embodiment of the present invention.

FIG. 5 is a view schematically showing an electronic component embedded substrate in accordance with yet another embodiment of the present invention.

Referring to FIG. 5, it will be understood that an insulating adhesive layer 210 may be provided between the first metal pattern 120 and the first insulating layer 110 and between the first metal pattern 120 and the electronic component 140, unlike the above-described embodiment.

That is, the insulating adhesive layer 210 may be provided to couple the first metal pattern 120 to the lower surface of the first insulating layer 110.

At this time, the above-described first via V1 should be electrically connected to the lower surface of the electronic component 140 or the lower surface of the external electrode 141 through the insulating adhesive layer 210.

Figure 6A:
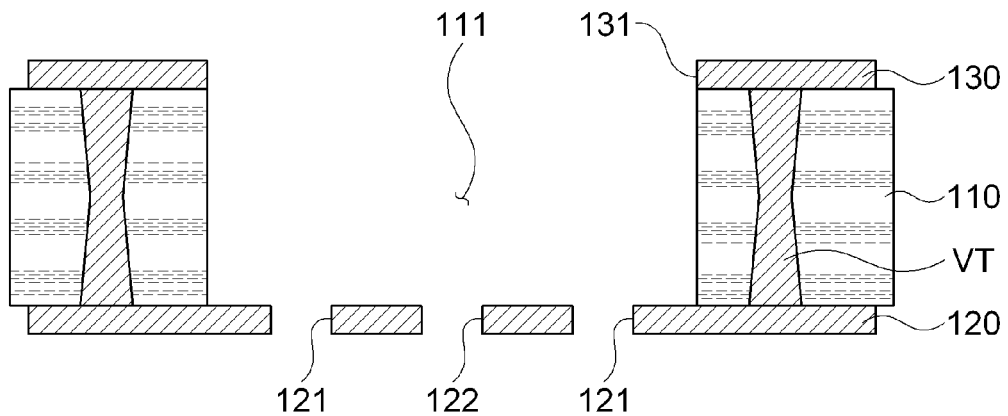
Figure 6B:
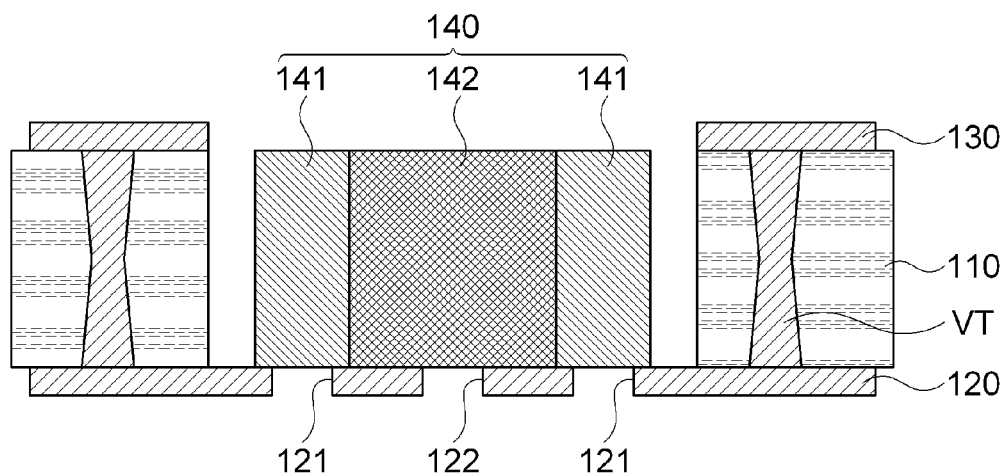
Figure 6C:
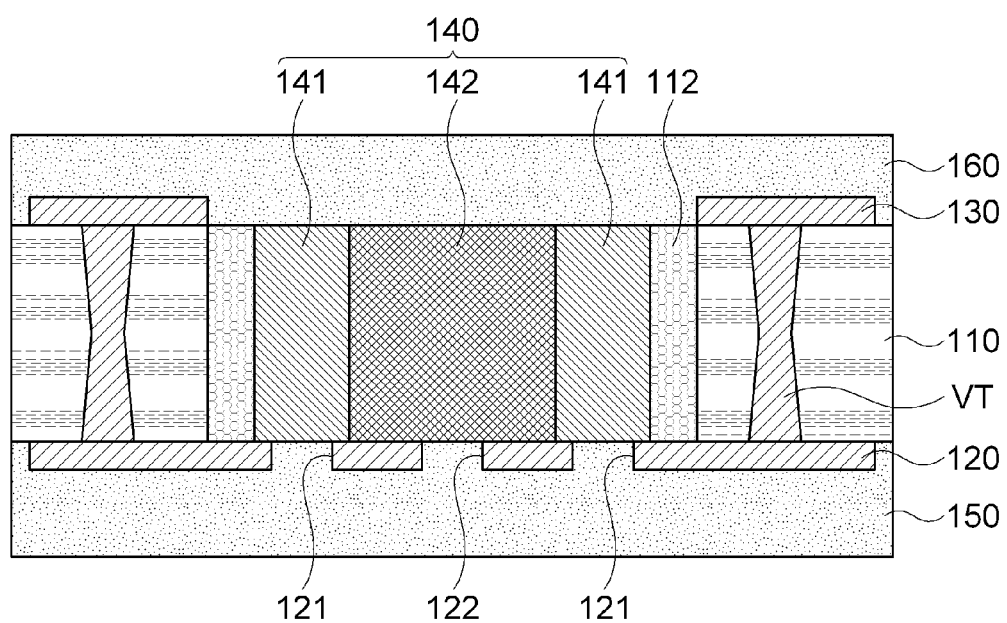
Figure 6D:
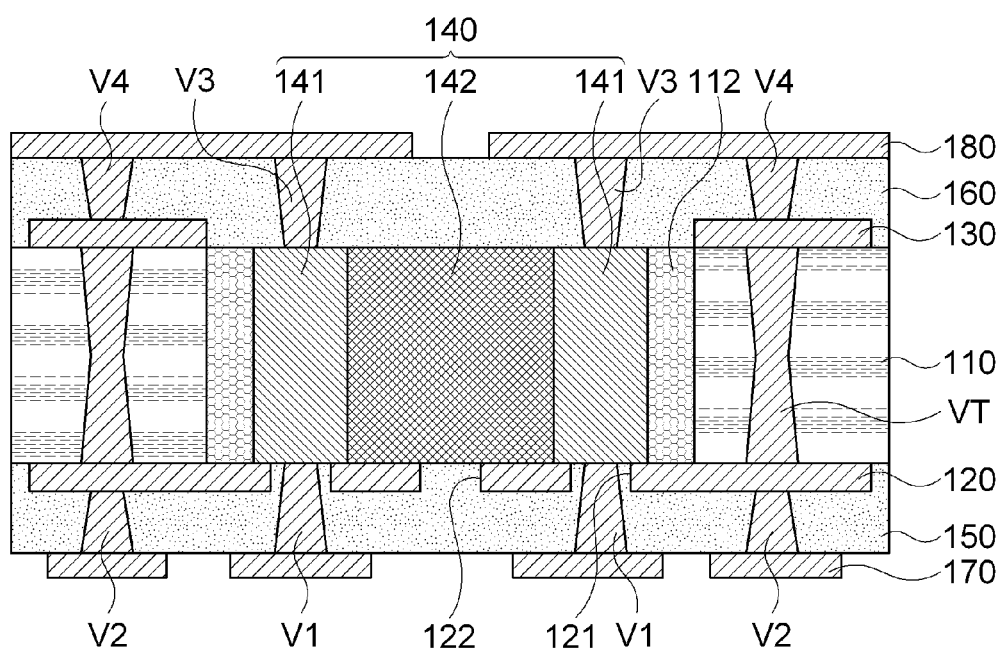
Figure 6E:
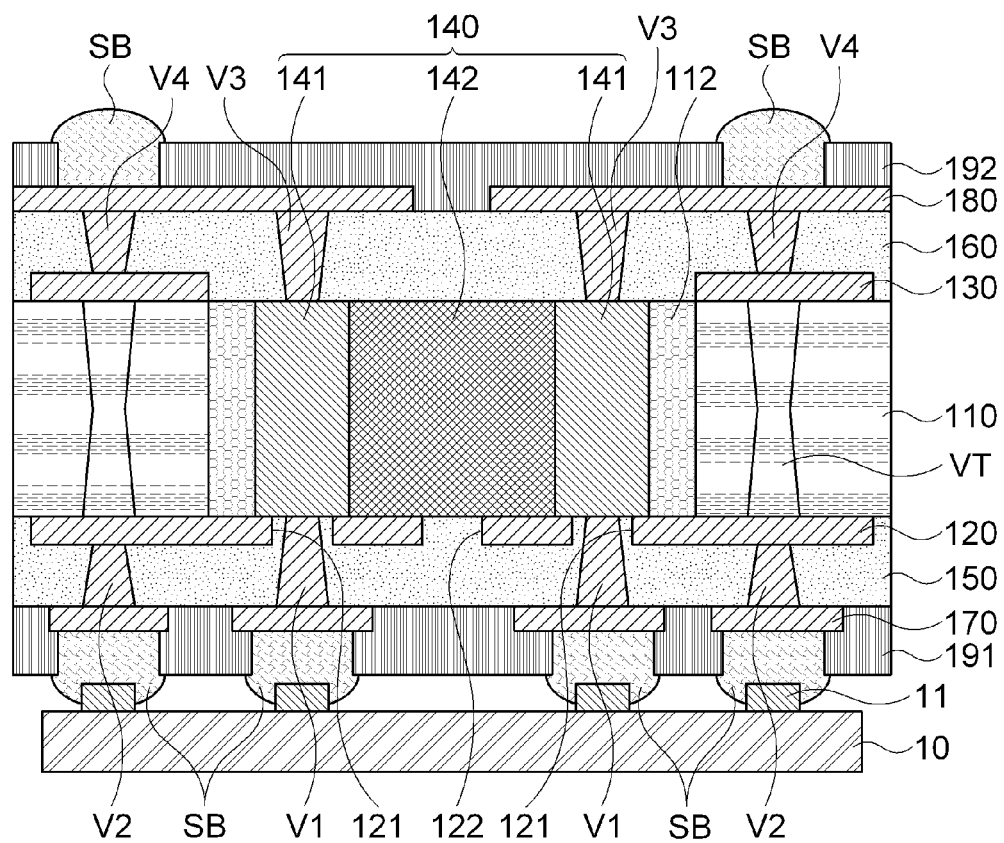

FIGS. 6a to 6e are process diagrams schematically showing a method of manufacturing an electronic component embedded substrate 100 in accordance with an embodiment of the present invention, wherein FIG. 6a is a cross-sectional view schematically showing the state before an electronic component 140 is inserted in a cavity 111, FIG. 6b is a cross-sectional view schematically showing the state in which the electronic component 140 is inserted in the cavity 111, FIG. 6c is a cross-sectional view schematically showing the state in which a second insulating layer 150 and a third insulating layer 160 are formed, FIG. 6d is a cross-sectional view schematically showing the state in which a via and a circuit pattern are formed on the second insulating layer 150 and the third insulating layer 160, and FIG. 6e is a cross-sectional view schematically showing the state in which a solder resist and a solder bump SB are formed and a surface mount component 10 is coupled.

Referring to FIG. 6a, a first metal pattern 120 may be formed on a lower surface of a first insulating layer 110.

At this time, a guide hole 121 and a gap 122 may be provided in the first metal pattern 120.

Further, a second metal pattern 130 having a mask hole 131 may be coupled to an upper surface of the first insulating layer 110. In this case, the cavity 111 may be formed in the first insulating layer 110 by irradiating laser to the mask hole 131.

Referring to FIG. 6b, the electronic component 140 may be inserted in the cavity 111 of the first insulating layer 110.

At this time, as shown, the electronic component 140 may be a passive element such as a capacitor but not limited thereto.

Further, although the drawing shows that the entire portion of the electronic component 140 is inserted in the cavity 111, it is apparent that a portion of the electronic component 140 can project outside the cavity 111.

Referring to FIG. 6c, the second insulating layer 150 may be formed under the electronic component 140 in a state in which the electronic component 140 is inserted in the cavity 111, and the third insulating layer 160 may be formed on the electronic component 140.

Referring to FIG. 6d, vias V1, V2, V3, and V1' may be formed in the second insulating layer 150 and the third insulating layer 160 so that the electronic component 140 or the second metal pattern 130 can be electrically connected to a first circuit pattern 170 and a second circuit pattern 180.

At this time, since a lower surface of an external electrode 141 of the electronic component 140 is exposed by the guide hole 121, even though a size of the external electrode 141 is reduced, the first via V1, which connects between the external electrode 141 and the first circuit pattern 170, can implement stable electrical connection regardless of placing tolerance of the electronic component 140 or via hole processing tolerance.

Referring to FIG. 6e, a first solder resist 191 may be provided on a lower surface of the first circuit pattern 170, and a solder bump SB, which is in contact with the first circuit pattern 170, may be provided to be connected to the surface mount component 10 such as a semiconductor chip.

Further, a second solder resist 192 and a solder bump SB may be provided on an upper surface of a second circuit pattern 180.

Figure 7A:
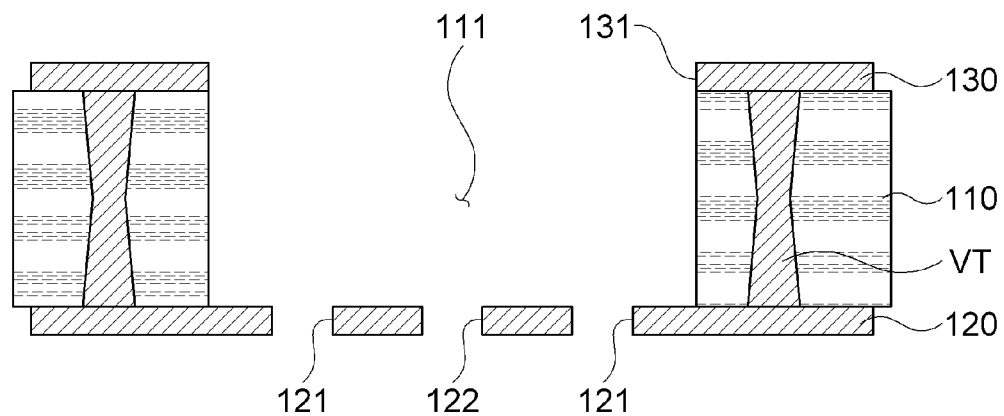
Figure 7B:
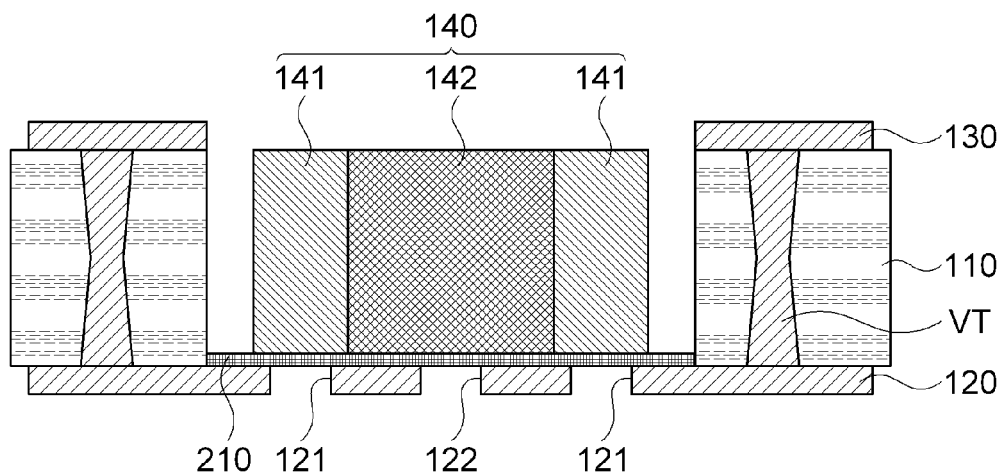
Figure 7C:
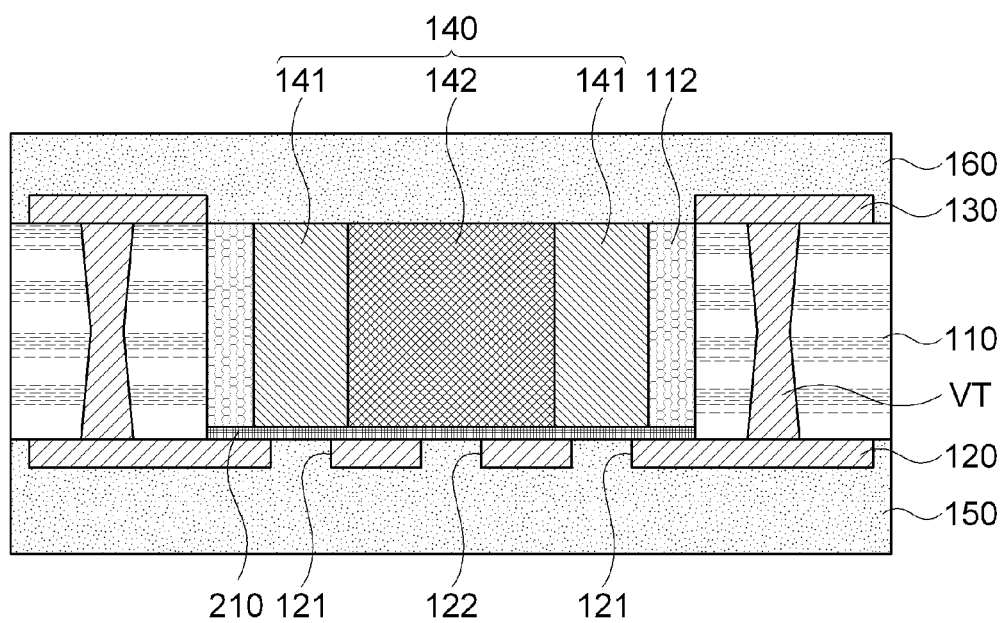
Figure 7D:
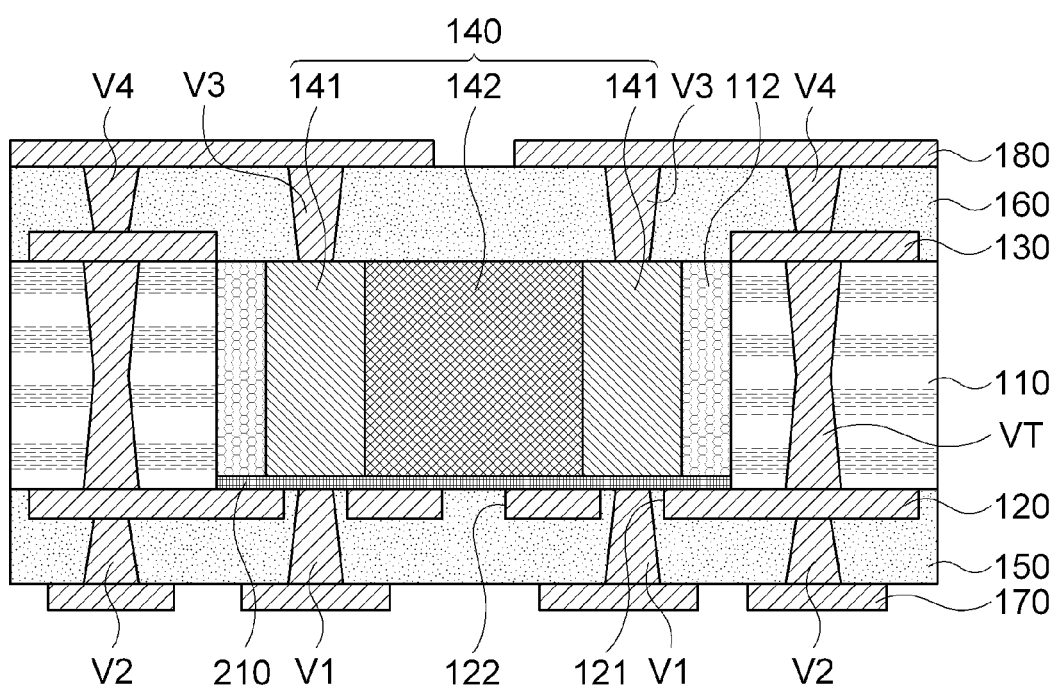
Figure 7E:
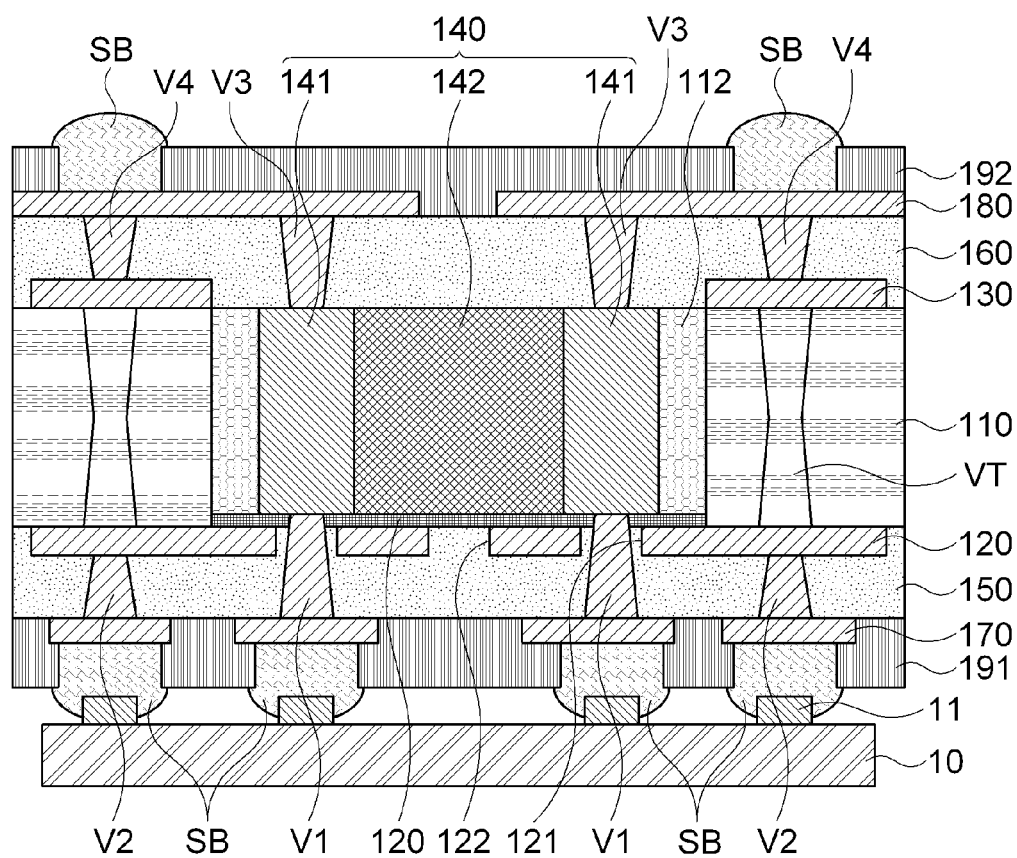

FIGS. 7a to 7e are process diagrams schematically showing a method of manufacturing an electronic component embedded substrate 200 in accordance with another embodiment of the present invention, wherein FIG. 7a is a cross-sectional view schematically showing the state before an electronic component 140 is inserted in a cavity 111, FIG. 7b is a cross-sectional view schematically showing the state in which the electronic component 140 is inserted in the cavity 111 and the electronic component 140 is fixed by an insulating adhesive layer 210, FIG. 7c is a cross-sectional view schematically showing the state in which a second insulating layer 150 and a third insulating layer 160 are formed, FIG. 7d is a cross-sectional view schematically showing the state in which a via and a circuit pattern are formed on the second insulating layer 150 and the third insulating layer 160, and FIG. 7e is a cross-sectional view schematically showing the state in which a solder resist and a solder bump SB are formed and a surface mount component 10 is coupled.

Referring to FIGS. 7a to 7e, it will be understood that the electronic component 140 and a first metal pattern 120 are coupled in a state in which the insulating adhesive layer 210 is applied on a lower surface of the electronic component 140 before the electronic component 140 is inserted in the cavity 111 or in a state in which the insulating adhesive layer 210 is applied on an upper surface of the first metal pattern 120.

Further, referring to FIG. 5, it will be understood that the insulating adhesive layer 210 may be provided between the first metal pattern 120 and a first insulating layer 110 and between the first metal pattern 120 and the electronic component 140 to perform a function of coupling the first metal pattern 120 to a lower surface of the first insulating layer 110 and a function of coupling the lower surface of the electronic component 140 to the upper surface of the first metal pattern 120.

Since the present invention configured as above can process a precise via hole even when the size of the external electrode of the electronic component is reduced than before, it is possible to overcome the conventional problems that the smaller the size of the external electrode, the lower the connectivity between the external electrode and the via due to factors such as placing tolerance, via hole processing tolerance, and via hole size.

Further, the first metal pattern can perform a role of supporting the electronic component in the process of mounting the electronic component in the cavity, and the first metal pattern itself can perform a function as a circuit pattern that provides a conducting path inside the electronic component embedded substrate.

What is claimed is:

1. An electronic component embedded substrate comprising:
   a first insulating layer having a cavity;
   an electronic component inserted in the cavity and having at least one external electrode;
   a first metal pattern formed on one surface of the first insulating layer configured to mount the electronic component thereon and comprising at least one guide hole exposing a portion of the external electrode;
   a second insulating layer formed on the one surface of the first insulating layer covering the first metal pattern;
   a first circuit pattern formed on one surface of the second insulating layer; and
   a first via passing through the guide hole of the first metal pattern and electrically connecting the external electrode exposed through the guide hole and the first circuit pattern,
   wherein an opening of the guide hole is smaller than an opening of the cavity, and
   wherein the opening of the guide hole is smaller than the external electrode.

2. The electronic component embedded substrate according to claim 1, wherein the first metal pattern is formed in plural number to correspond in registration with the respective external electrodes, and the first metal patterns are separated from each other by a gap.

3. The electronic component embedded substrate according to claim 1, further comprising:
   a second via electrically connecting the first metal pattern and the first circuit pattern.

4. The electronic component embedded substrate according to claim 1, further comprising:
   a second metal pattern formed on an other surface of the first insulating layer to define a formation region of the cavity.

5. The electronic component embedded substrate according to claim 4, wherein a sidewall of the second metal pattern and a sidewall of the cavity are positioned on the same plane.

6. The electronic component embedded substrate according to claim 4, wherein the second metal pattern is disposed to be separated from a sidewall of the cavity.

7. The electronic component embedded substrate according to claim 4, further comprising:
   a through-via passing through the first insulating layer to electrically connect the first metal pattern and the second metal pattern.

8. The electronic component embedded substrate according to claim 4, further comprising:
   a third insulating layer formed on the other surface of the first insulating layer to cover the second metal pattern and the electronic component; and
   a second circuit pattern formed on one surface of the third insulating layer.

9. The electronic component embedded substrate according to claim 8, further comprising:
   a third via passing through the third insulating layer to electrically connect the external electrode and the second circuit pattern.

10. The electronic component embedded substrate according to claim 8, further comprising:
    a fourth via passing through the third insulating layer to electrically connect the second circuit pattern and the second metal pattern.

11. The electronic component embedded substrate according to claim 8, further comprising:
    a filler filling a space between the cavity and the electronic component.

12. The electronic component embedded substrate according to claim 11, wherein the third insulating layer and the filler are formed integrally.

13. The electronic component embedded substrate according to claim 1, wherein an insulating adhesive layer is further provided between the electronic component and the first metal pattern, and
    the first via is in contact with the external electrode through the insulating adhesive layer.

14. The electronic component embedded substrate according to claim 1, wherein the first via is self-aligned with the external electrode by the guide hole.

15. The electronic component embedded substrate according to claim 1, wherein the first metal pattern is in contact with the external electrode.

16. The electronic component embedded substrate according to claim 15, wherein the first via is in contact with the external electrode exposed through the guide hole and the first metal pattern.

17. The electronic component embedded substrate according to claim 1, wherein the first via is smaller than the opening of the guide hole.

18. The electronic component embedded substrate according to claim 1, wherein both the first metal pattern and the first via directly contact the external electrode.

* * * * *